(12) United States Patent
Albert et al.

(10) Patent No.: US 9,866,006 B2
(45) Date of Patent: Jan. 9, 2018

(54) DEVICE FOR ESTABLISHING ELECTRICAL CONTACT BETWEEN A SHIELD OF AN ELECTRICAL CABLE AND A HOUSING, AND A PRE-ASSEMBLED CABLE

(71) Applicant: LEONI BORDNETZ-SYSTEME GMBH, Kitzingen (DE)

(72) Inventors: Volker Albert, Dettelbach (DE);
Michael Pieczka, Iserlohn (DE);
Alexander Kett, Luhe-Wildenau (DE);
Christian Dehn, Altdorf (DE)

(73) Assignee: LEONI Bordnetz-Systeme GmbH, Kitzingen (DE)

( * ) Notice: Subject to any disclaimer, the term of this patent is extended or adjusted under 35 U.S.C. 154(b) by 0 days.

(21) Appl. No.: 15/000,201

(22) Filed: Jan. 19, 2016

(65) Prior Publication Data

US 2016/0134093 A1    May 12, 2016

Related U.S. Application Data

(63) Continuation of application No. PCT/EP2014/065174, filed on Jul. 15, 2014.

(30) Foreign Application Priority Data

Jul. 17, 2013   (DE) .................... 20 2013 006 413 U

(51) Int. Cl.

| H05K 9/00 | (2006.01) |
|---|---|
| H02G 15/013 | (2006.01) |
| H01R 9/05 | (2006.01) |
| H01R 13/6597 | (2011.01) |
| H01R 13/74 | (2006.01) |

(Continued)

(52) U.S. Cl.
CPC ............. *H02G 15/013* (2013.01); *H01R 4/20* (2013.01); *H01R 9/0518* (2013.01); *H01R 13/6597* (2013.01); *H01R 13/741* (2013.01); *H02G 3/0616* (2013.01); *H05K 9/0098* (2013.01);
(Continued)

(58) Field of Classification Search
CPC .................................................. H05K 9/0018
See application file for complete search history.

(56) References Cited

U.S. PATENT DOCUMENTS

| 7,113,679 B2 | 9/2006 | Melton et al. |
| 7,427,215 B2 | 9/2008 | Heckmann et al. |

(Continued)

FOREIGN PATENT DOCUMENTS

| CN | 101533137 A | 9/2009 |
| CN | 102341965 | 2/2012 |

(Continued)

*Primary Examiner* — Hung V Ngo
(74) *Attorney, Agent, or Firm* — Laurence A. Greenberg; Werner H. Stemer; Ralph E. Locher

(57) ABSTRACT

In order to ensure a reliable connection between a shield of a high-voltage cable and a housing, in particular for an electric or hybrid vehicle, the shield of the cable is crimped between an under-sleeve and a contact sleeve, forming an electrically conductive connection with the housing via the contact sleeve. The contact sleeve, formed as a crimp sleeve, also has a rim made of spring tongues. In addition, the under-sleeve is also simultaneously crimped with a cable sheathing of the cable in order to create a strain relief. Furthermore, the cable can be preferably fixed to the housing by a simple plug-locking connection.

16 Claims, 5 Drawing Sheets

(51) Int. Cl.
   *H01R 4/20*      (2006.01)
   *H02G 3/06*      (2006.01)
   *H02G 15/04*     (2006.01)

(52) U.S. Cl.
   CPC ......... *H02G 3/0666* (2013.01); *H02G 15/046* (2013.01)

(56) References Cited

U.S. PATENT DOCUMENTS

| | | |
|---|---|---|
| 7,893,354 B2 | 2/2011 | Albert et al. |
| 8,585,415 B2 | 11/2013 | Marsh et al. |
| 8,766,094 B2 * | 7/2014 | Citurs ................. H01R 13/187 174/51 |
| 8,858,261 B2 | 10/2014 | Baeuerle |
| 2015/0237771 A1 * | 8/2015 | Natter ................. H05K 9/0098 174/77 R |

FOREIGN PATENT DOCUMENTS

| | | |
|---|---|---|
| DE | 202004014020 U1 | 2/2006 |
| DE | 102007051836 A1 | 5/2009 |
| DE | 102010052627 A1 | 6/2011 |
| DE | 102010014982 A1 | 10/2011 |
| DE | 102011102566 A1 | 9/2012 |
| EP | 2515387 A1 | 10/2012 |

\* cited by examiner

DEVICE FOR ESTABLISHING ELECTRICAL CONTACT BETWEEN A SHIELD OF AN ELECTRICAL CABLE AND A HOUSING, AND A PRE-ASSEMBLED CABLE

CROSS-REFERENCE TO RELATED APPLICATION

This is a continuation application, under 35 U.S.C. §120, of copending international application No. PCT/EP2014/065174, filed Jul. 15, 2014, which designated the United States; this application also claims the priority, under 35 U.S.C. §119, of German patent application No. DE 20 2013 006 413.7, filed Jul. 17, 2013; the prior applications are herewith incorporated by reference in their entirety.

BACKGROUND OF THE INVENTION

Field of the Invention

The invention relates to a device for establishing electrical contact between a shield of an electrical cable and a housing, and to a pre-assembled electrical cable.

The invention here relates in particular to a device of this type and a cable of this type for employment as a high-voltage cable in an electric or hybrid vehicle for supplying power to electrical high-voltage consumers, such as an electric traction motor, for example. In high-voltage cables of this type a shield is required to keep the other electronic on-board circuits free from interferences. "High voltage" here is understood to be a voltage range of typically about 300 V to 800 V.

The high-voltage cables here connect a power and voltage source, in particular a battery or a generator to a consumer, for example the electric traction motor. When the cable is connected to the respective component, the shield of the cable has to be electrically connected to the housing of the respective component in a reliable and secure manner, so as to achieve continuous shielding. Here, simple and preferably reversible fitting of the cable on the component should also be provided if possible. Moreover, a strain relief must also be integrated in the connection point between the cable and the component. Regardless of desirable and reversible releasability of the cable on the housing, secure attachment of the shield over a long period of time is required. Shield attachment systems known nowadays are generally comparatively complex. The shield attachment systems are performed by way of a screw attachment of the cable, for example.

A high-voltage cable loom for a motor vehicle, in which for attaching the shield of the cable loom on a housing lead-through the shield is jammed between a crimp sleeve and an under-sleeve, is described in published, non-prosecuted German patent application DE 10 2007 051 836 A1, corresponding to U.S. Pat. No. 7,893,354. The under-sleeve here at the end side has a head region by way of which the under-sleeve bears in an electrically conducting manner on a fastening plate by way of which electrical contact of the shield on a housing is established.

In order for electrical contact of shields to be established, the use of sleeve-shaped elements, for example, having spring tongues in which the spring tongues are urged against the shield in an elastic manner are also known in general. Establishing electrical contact in this manner may be derived from European patent EP 2 515 387, for example.

Moreover, a plug connection having a shield contact element may be derived from published, non-prosecuted German patent application DE 10 2010 014 982 A1 (corresponding to U.S. Pat. No. 8,858,261), wherein establishing electrical contact of the shield of the cable is performed by way of a plug housing of the plug part per se. In order for electrical contact of the shield to be established, a crimp sleeve assembly composed of an under-sleeve and a crimp sleeve is configured on the one hand. Electrical contact between the crimp sleeve and the housing of the plug part is achieved by way of an additional sleeve part which contacts the crimp sleeve on the one hand and the internal housing wall on the other hand.

SUMMARY OF THE INVENTION

Proceeding therefrom, the invention is based on the object of enabling electrical contact of the shield to be established in an improved manner.

According to the invention, the object is achieved by a device for establishing electrical contact between a shield of an electrical cable and a housing, wherein the device contains an electrical cable which has a shield which is surrounded by a cable sheathing and wherein the cable in the fitted state is routed by way of a cable gland of the housing. The device furthermore contains an under-sleeve and a contact sleeve, wherein the contact sleeve is press-fitted, in particular crimped, to the under-sleeve while the shield is interlayered, and is connected in an electrically conducting manner to the housing. The contact sleeve at the end side furthermore has a plurality of contact springs which are disposed so as to be encircling in particular in the manner of a crown and which in the manner of spring tongues are bent toward the outside in a radial manner. By way of these spring tongues the contact sleeve in the fitted state is embedded in an internal wall of the cable gland, such that electrical contact of the shield is established on the housing.

On account of the press-fitting or crimping process, deformation of the contact sleeve is performed, such that the shield is jammed in a reliable and secure manner and is in particular held in a form-fitting manner. Apart from establishing reliable electrical contact of the shield, a certain degree of strain relief is also achieved thereby. The shield is preferably disposed directly between the under-sleeve and the contact sleeve.

It is furthermore of particular advantage and relevance that the integral crimp and contact sleeve at the same time also has the spring tongues, such that by way of this integral contact sleeve reliable electrical contact of the shield via the crimp-fit, on the one hand, and electrical contact on the housing via the spring tongues, on the other hand, is established. The contact sleeve therefore has a dual function. With a view to the crimp function, the contact sleeve here is plastically deformable in a suitable manner, on the one hand, and on the other hand the contact sleeve in the region of the spring tongues has sufficient elasticity so as to guarantee the desired elastic contact compression on the cable gland. This allows simple fitting as well as a design embodiment of the entire device which is simple in terms of construction.

The under-sleeve here on the external side is expediently attached to the cable sheathing and, on account of the contact sleeve being crimped, is press-fitted into the cable sheathing. Therefore, double crimping is performed in only one crimping procedure; the contact sleeve is press-fitted and crimped to the under-sleeve, on the one hand, and the deformation force which is exerted in the crimping process at the same time is set such that the under-sleeve is also press-fitted into the cable sheathing. To this extent there is a double-action press-fit. On account of the under-sleeve being press-fitted into the cable sheathing, the former is held on the cable in a form-fitting manner and thus secured against extraction. On account thereof, a reliable strain relief is configured in addition to the reliable shield.

Fastening of the cable to the cable gland is expediently performed by way of the closure cap which is preferably configured for reversible fastening to the cable gland. In order for fitting and also disassembly which is as simple as possible to be enabled, the closure cap here is provided with a snap-fit element which interacts with a corresponding snap-fit element on the cable gland so as to configure a snap-fit connection which is preferably releasable in a reversible manner. In particular, the closure cap therefore in general is configured so as to be fastenable to the cable gland without tools.

With a view to a transport protection device which is as reliable as possible, the closure cap here is part of a multipartite, in particular a bipartite cap assembly which apart from the closure cap also has a front-side protective cap. The latter encloses a front-side part of the contact sleeve and in particular the part of the contact tongues. The protective cap serves as only temporary transportation protection device and is thus removed for fitting the cable to the housing. On account of this multipartite cap assembly, the region of the contact sleeve is completely and reliably encapsulated. On account thereof, there is at the same time the potential for the contact tongues to project from the closure cap in the longitudinal direction and for the contact tongues to be able to be pushed into the cable gland to a maximum depth.

The cable gland and the closure cap thus mutually engage in the manner of two sleeves, the closure cap being pulled over the cable gland. The closure cap is usually configured from an isolating material, whereas the housing is electrically conductive, in particular also for the function as an electrical shield. On account of the closure cap being pulled over, electrical isolation of the cable gland for safe contacting is thus achieved at the same time.

The cable gland in the fitted state is embedded between the closure cap and the contact sleeve. For electrically linking the shield of the cable, the contact sleeve is therefore located on the inside of the cable gland, and the spring tongues are pressed against the internal wall of this cable gland. An annular space in which the sleeve-shaped cable gland is pushed into during fitting is therefore configured between the contact sleeve and the closure cap. Since the cable gland is jammed between the closure cap and the contact sleeve, so to speak, the contact sleeve is pressed against the internal wall of the cable gland at a defined contact pressure, so as to ensure reliable electrical connection.

Further improvement of assured contact is expediently achieved in that the contact sleeve at both end sides has spring tongues, the latter in particular being completely encircling. The contact sleeve thus at the front end thereof and at the rear end side thereof has a crown of spring tongues which are bent outward in a radial manner.

The spring tongues are expediently configured so as to be dissimilar to one another and specifically in a manner so as to have dissimilar mechanical natural vibration frequencies. This design embodiment is based on the concept that vibrations arise during employment in a motor vehicle, the vibrations under certain circumstances exciting the spring tongue to vibrate, so that in the worst case the electrically conducting contact between a respective spring tongue and the housing is interrupted at least for a short duration. On account of the dissimilar design embodiments having dissimilar natural frequencies, it is now ensured that even in the worst case at least some of the spring tongues have an ongoing bearing with a reliable electrical contact.

With a view to the contact sleeve being manufactured in as simple a manner as possible, the contact sleeve is configured from a bent punched sheet-metal part. Here, a desired shape having the spring tongues is punched from a planar sheet-metal blank in one method step. This flat structure is subsequently formed to a sleeve. For example, mutually opposite end sides of the sheet-metal are welded together at a point of abutment. As an alternative to a bent punched sheet-metal part, the contact sleeve and preferably also other sleeves are configured as deep-drawn parts.

In general, the spring tongues in the direction toward the housing on which electrical contact is to be established are configured with sharp edges. On account of this sharp-edged configuration any potential oxide layer which is configured on the surface of the housing is breached, so as to provide reliable electrical linking. The sharp-edged configuration here is expediently implemented by way of a punching burr which during the punching procedure is deliberately not deburred.

Apart from electrically linking the shield to the housing, a sealed routing of the cable through the cable entry is also required in principle. In order for the latter to be guaranteed, a sealing element is embedded in the closure cap, the cable being routed through said sealing element.

A closed sealing space which is in particular closed on the base side is formed here within the closure cap. The sealing space according to a first variant is closed off by a holder which is oriented in the direction toward the contact sleeve. The sealing element thus lies in a reliable manner in a defined space between the holder and the closure cap.

The holder here in the longitudinal cable direction preferably adjoins the contact sleeve which is fastened at the end side to the cable, so that the holder, on account of the mechanical stop on the contact sleeve which is crimp-fitted in the cable sheathing forms a stop for the sealing element, which is effective in the longitudinal direction.

The holder here is expediently pulled over the cable sheathing in the manner of a sleeve and contains a sleeve shaft by way of which the holder bears on the cable sheathing. With a view to a space-saving design embodiment, the contact sleeve here by way of the one end region thereof is pulled over this sleeve shaft. The sleeve shaft therefore extends in particular into the end side of the contact sleeve, which is formed by the crown of the spring tongues.

A spacer which has an annular web which holds the cable in a centric manner in the cable entry is furthermore disposed. The spacer here is in particular formed by the afore-described holder. Apart from serving in centering the cable within the cable gland, the annular web therefore at the same time serves as a stop for the sealing element.

According to a first variant of embodiment, the holder or the spacer, respectively, here is a discrete component. In an alternative design embodiment, the spacer is configured as a part-region of the under-sleeve per se. The latter in this case therefore has the annular web or collar. On account thereof, the multiplicity of parts is further reduced.

In order for a defined position of the contact sleeve to be guaranteed for reliable electrical linking within the cable gland, there is a stop on which the contact sleeve is at least indirectly supported, and in one variant of the embodiment is directly supported in the longitudinal direction. Apart from the jamming effect of the contact sleeve in the radial direction on account of the spring tongues, a jamming effect in the axial direction is preferably also achieved, so that the contact sleeve is embedded in an overall tensioned manner.

According to one preferred variant of embodiment, the contact sleeve is surrounded by an intermediate sleeve. The latter in the fitted state is positioned between the contact sleeve and the cable gland. This intermediate sleeve is preferably a plastics sleeve. The latter serves in particular for extended positioning and guiding of the contact sleeve, for example when the cable is transported to a fitting site, or else in the fitted state within the cable gland.

For simple fitting, the intermediate sleeve is configured having a plurality of shells, in particular two half-shells, such that the intermediate sleeve may be placed around the contact sleeve.

In an expedient design embodiment it is provided here that the intermediate sleeve for axially fixing the contact sleeve in a form-fitting manner is configured within the cable gland. By way of this intermediate sleeve, the contact sleeve is therefore positioned in a locationally fixed manner within the cable gland. To this end, the contact sleeve is positioned between a stop of the cable gland, on the one hand, and a crimped part, that is to say optionally the contact sleeve or the under-sleeve. To this end, the crimped part has an annular web or a collar which projects in the radial direction. By way of the double crimp-fit which has already been mentioned, the contact sleeve is fixed in a positionally fixed manner on the outer cable sheathing. A further stop, in addition to the stop on the cable gland, is formed by the collar, such that by way of these two defined stops and of the intermediate sleeve, a form-fit which acts in both directions in the longitudinal direction of the cable is configured.

In a preferred design embodiment, an auxiliary sleeve is disposed around the contact sleeve, acting as a crimping aid, so to speak. In this variant of embodiment, the contact sleeve which has in particular been made from a bent punched sheet-metal part is held in the predefined sleeve geometry with the aid of the auxiliary sleeve. In this variant, connection (welding) of opposite end sides is not required, for example, and preferably also not provided. The auxiliary sleeve is composed of metal, for example. Alternatively, the auxiliary sleeve is composed of plastics or else from another elastic material. During fitting, the auxiliary sleeve is attached already prior to the crimping process, such that it may serve as a crimping aid.

An insert which is composed of a material which in comparison with the connector end is dissimilar is expediently disposed in the connector end. This material is a material having particularly good electrical conductivity. In the fitted state the spring tongues bear on this insert. On account thereof, electrical linking which is as good as possible and contact resistances which are as low as possible are achieved. A copper alloy in particular, for example a copper-zinc alloy, or else tin or a tin-based alloy, is used for the material of the insert. The material of the connector end is often aluminum, as is the material of the entire housing.

The object according to the invention is furthermore achieved by a pre-assembled cable for a device of this type. The advantages and preferred design embodiments stated in respect of the device may also be applied in a corresponding manner to the pre-assembled electrical cable.

The electrical cable here in the final fitted state is disposed within an electric or hybrid vehicle and is connected to an electrical component of the vehicle.

Other features which are considered as characteristic for the invention are set forth in the appended claims.

Although the invention is illustrated and described herein as embodied in a device for establishing electrical contact between a shield of an electrical cable and a housing, and a pre-assembled cable, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

In the figures, parts with identical functions are provided with the same reference signs.

Figure 1A:
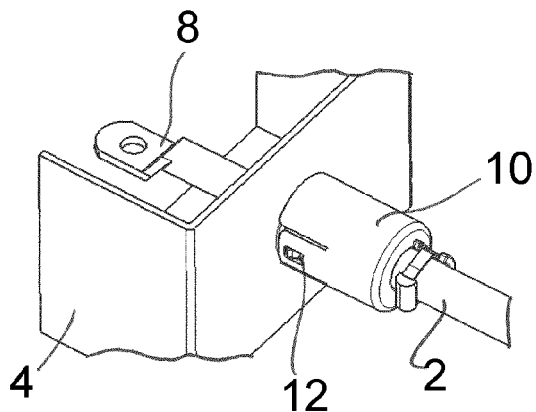
FIG. 1A is a diagrammatic, perspective overall view of a fastening of a high-voltage cable on a housing according to the invention, the viewing direction being toward an outer side of the housing.
Figure 1B:
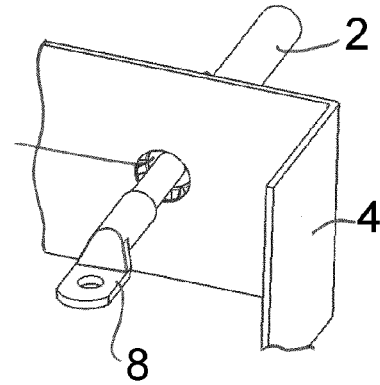
FIG. 1B is a perspective view showing the fastening of the high-voltage cable according to FIG. 1A, the viewing direction being toward the inner side of a blower.

Referring now to the figures of the drawing in detail and first to FIGS. 1A and 1B, there is shown an electrical high-voltage cable 2 is connected to a preferably metallic housing 4 and is routed through a cable entry 6 of the housing 4 into an interior. The cable 2 in the interior usually terminates at a contact element 8, for example a contact shoe such as is illustrated in FIGS. 1A, B. The cable 2 is connected to a contact terminal via the contact element 8, for example by way of a screw connection. The metallic housing is a cast metal housing, for example, in particular a die-cast aluminum housing.

Figure 2:
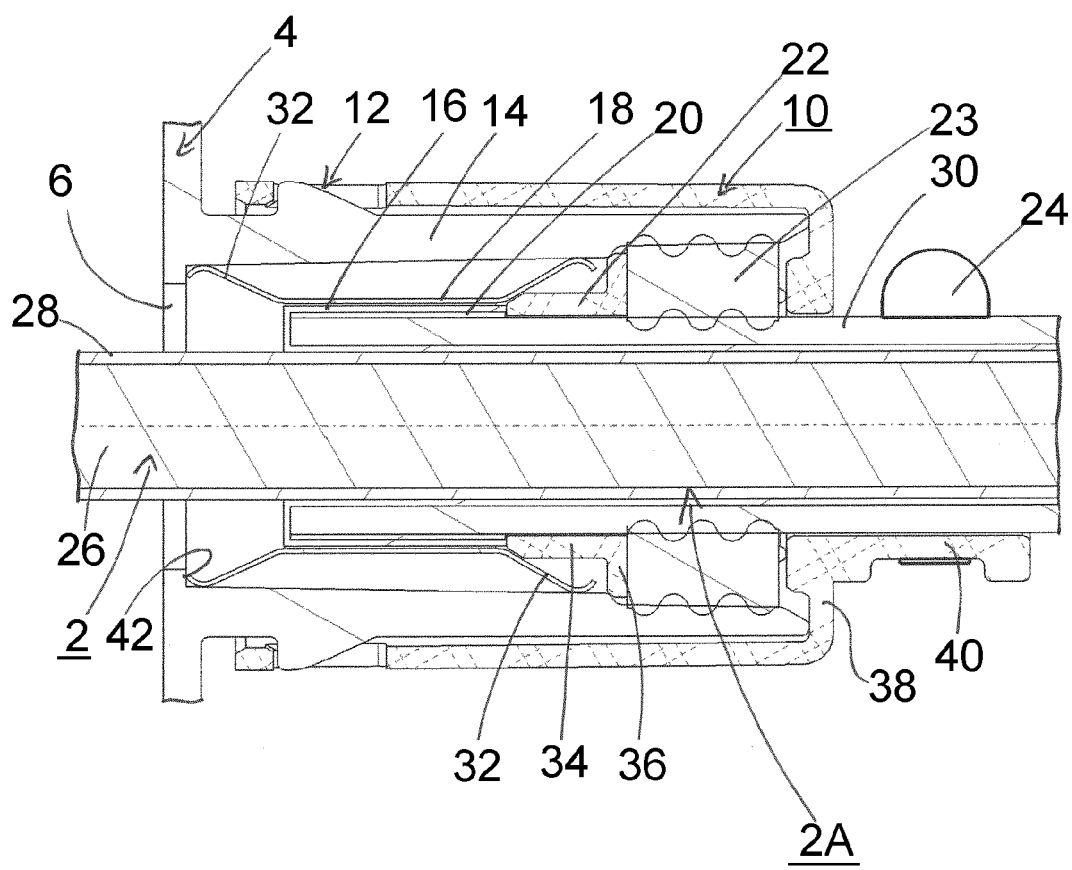
FIG. 2 is a cross-sectional view of a connector region of a connection between the cable and the housing, illustrated in FIGS. 1A and 1B.

As can be derived in particular from FIG. 2 and also in conjunction with FIG. 1A, in order for the cable 2 to be mechanically fastened to the housing 4, an approximately cup-shaped closure cap 10 which by way of a snap-fit connection 12 is fastened in a reversibly releasable manner to the housing 4 is disposed on the cable 2. To this end, a cable entry 6 has a cable gland 14 which in the longitudinal cable direction extends outwardly in a sleeve-shaped manner. The cable gland 14 on the external side thereof has a plurality of latching cams, in the exemplary embodiment two latching cams which are disposed so as to be mutually opposite, which for configuring the snap-fit connection 12 engage in a corresponding latching clearance of the closure cap 10. As can be derived in particular from FIG. 1A, the closure cap 10 on either side of the respective snap-fit receptacle is configured in a slotted manner, such that bending back of the closure cap 10 in an elastic manner is enabled in the region of the snap-fit receptacle. Fastening of the cable 2 to the cable gland 14 is therefore performed by simply push-fitting the closure cap 10 until the snap-fit connection 12 has been configured.

The housing 4 is usually configured in an electrically conducting manner. A shield 16 of the cable 2 is to be connected to this housing 4 so as to be electrically conducting and so as to be encircling by 360°, in order for a continuously reliable shield to be guaranteed.

Apart from the already mentioned closure cap 10, a suitably pre-assembled cable for establishing electrical contact of the shield 16 furthermore contains a contact sleeve 18, an under-sleeve 20, a spacer 22, a sealing element 23, and for fixing the closure cap 10 to the cable 2 a fixing element 24 which in the exemplary embodiment is configured as a cable tie.

The contact sleeve here is preferably composed of a copper material having resilient properties and, in particular, a tin-coated surface. The under-sleeve is also typically composed of a copper material of this type. The spacer 22 is configured as a plastics part, for example. The sealing element 23 is configured as a silicone sealing element, in particular. The closure cap 10 in turn is a plastic part and is made, for example, from the same material as the spacer 22, for example from polyamide.

The cable 2 in general has a conductor 26 which is surrounded by a conductor insulation 28 which in turn is surrounded by the shield 16 which is configured as a braided metal shield, for example. The shield 16 in turn is surrounded by a cable sheathing 30. The conductor 26 is a strand, for example, composed of a multiplicity of individual wires, so as to enable high bending flexibility. The cable 2 overall is conceived for transmitting high power of a plurality of kW of electrical power, and for high voltages.

As can be derived in particular by the cross-sectional illustrations of FIG. 2, the shield 16 is folded back by approximately 180° around a frontal end of the cable sheathing 30, wherein the under-sleeve 20 is attached to the cable sheathing 30, such that the under-sleeve 20 is embedded between the cable sheathing 30 and the folded-back part-region of the shield 16. The contact sleeve 18 is disposed in this region of the under-sleeve 20 by way of a central region which on both sides is adjoined by end sides of the contact sleeve which are outwardly curved in a radial manner. These end sides are in each case composed of an encircling crown which is formed by a multiplicity of individual spring tongues 32 which in each case define one contact spring (see in particular also FIG. 3B in this context).

As an alternative to the illustrated variant of embodiment of the contact sleeve 18, having the widened ends which form the crown of the spring tongues 32 at either end, only one end of the contact sleeve 18 is widened, and at the opposite end which is oriented toward the spacer 22 the widened end is replaced by a corresponding end of the under-sleeve 20, which has been widened. In this alternative design embodiment, the contact sleeve 18 and the under-sleeve 20 are therefore in each case widened at one end, so as to configure a crown of spring tongues 32. The spacer 22 is therefore embedded in that end of the under-sleeve 20 that is pulled outward in a radial manner, as the spacer 22 according to FIG. 2 is embedded in the widened end of the contact sleeve 18. Both sleeves 18, 20 here are configured as deep-drawn parts, for example.

The sleeve-shaped spacer 22 adjoins the central region of the contact sleeve 18 in the longitudinal direction of the cable. The spacer 22 contains a sleeve shaft 34 which at the end side transitions into an annular web 36. The sealing element 23 directly adjoins the annular web 36.

The sealing element 23 on the internal surface thereof as well as on the external surface on the circumferential side has a profile, in particular an undulated profile, such that individual sealing webs are configured in order to configure reliable and secure sealing in relation to the cable 2, on the one hand, and in relation to the cable gland 14, on the other hand.

The spacer 22 here directly adjoins the contact sleeve 18 and the under-sleeve 20, and in particular is supported in the longitudinal direction on at least one of these components. At the same time, the spring tongues 32 are pulled over the sleeve shaft 34, such that a design configuration which is as compact as possible is achieved overall.

The cable 2 is held in a centric manner within the cable gland by way of the spacer 22. The annular web 36 in the radial extent thereof is therefore dimensioned in such a manner that the former is adapted to the internal diameter of the cable gland.

As can be seen in FIG. 2, the cable gland 14 here on the internal side of the sheathing thereof, level with the annular web 36 (in the final fitted position), preferably contains a rebound which is in particular caused by a thickening of the material and which is configured as an incline, for example, or else as a rounded step, as is illustrated. To this extent, this rounded step here configures an introduction aid for the annular web 36. The annular web 36 here is expediently dimensioned in such a manner that the annular web 36 contacts the wall of the cable gland 14 both in the axial as well as in the radial direction.

In the front end-side region ahead of the rebound, the cable gland 14 therefore has an annular sheathing face having a somewhat enlarged internal diameter. This annular sheathing face here configures a sealing face which in particular has a high-quality surface finish and has undergone separate post-treatment, for example. The cable gland at the front end side thereof finally has an introduction chamfer.

The closure cap 10 per se is configured in an overall cup-shaped manner and receives the afore-described elements in the cap interior which is formed by the closure cap 10. The latter therefore also surrounds in particular the contact sleeve 18 and thus forms a mechanical (transportation) protection device for the latter, in order for the pre-assembled cable to be able to be transported to the fitting site without the risk of damage.

The closure cap 10 here has an annular base 38 through which the cable 2 is routed. A retaining web 40, by way of which fixing to the cable sheathing 30 is performed with the aid of the fixing element (for example a cable tie), adjoins the base 38 along a part-circumference. The closure cap 10 which otherwise is held so as to be displaceable on the cable sheathing 30 is held on the cable 2 in a desired position by way of this fixing.

As can be seen in particular from FIG. 2, the cable gland 14 engages in an annular space between the closure cap 10 and the contact sleeve 18 and reaches down to the base 38. The spring tongues 32 by way of their spring force are pushed against the internal wall of the cable gland 14 in a reliable manner. A stop 42 on which the front crown of the springs tongue 32 is furthermore configured directly in the region of the cable entry 6.

The cable 2 is provided as a pre-assembled cable 2A for fitting to the housing 4, and is supplied by a component supplier to the production line of the automotive manufacturer, for example. The pre-assembled cable 2A here shows the same construction as has been illustrated in FIG. 2, but without the housing 4. For fastening to the housing 4, the pre-assembled cable 2A needs only to be latched to the housing 4 by way the closure cap 10.

Figure 3A:
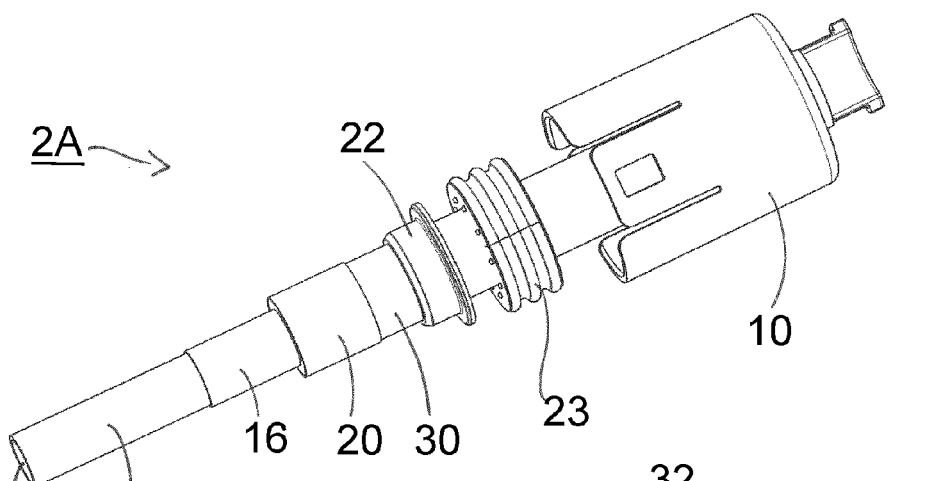
FIG. 3A is a perspective illustration of a detail view of the high-voltage cable, for explaining a fitting procedure of the individual components for configuring a pre-assembled cable.
Figure 3B:
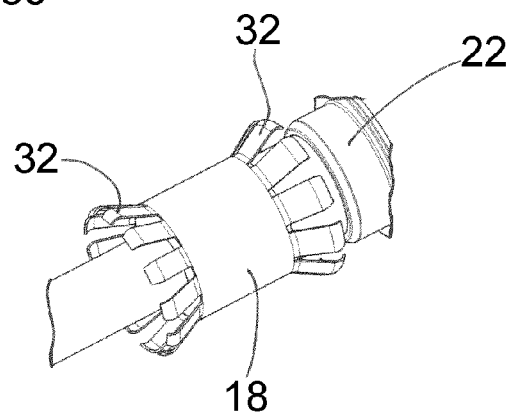
FIG. 3B is a perspective illustration of the cable for further explaining the fitting procedure.
Figure 4:
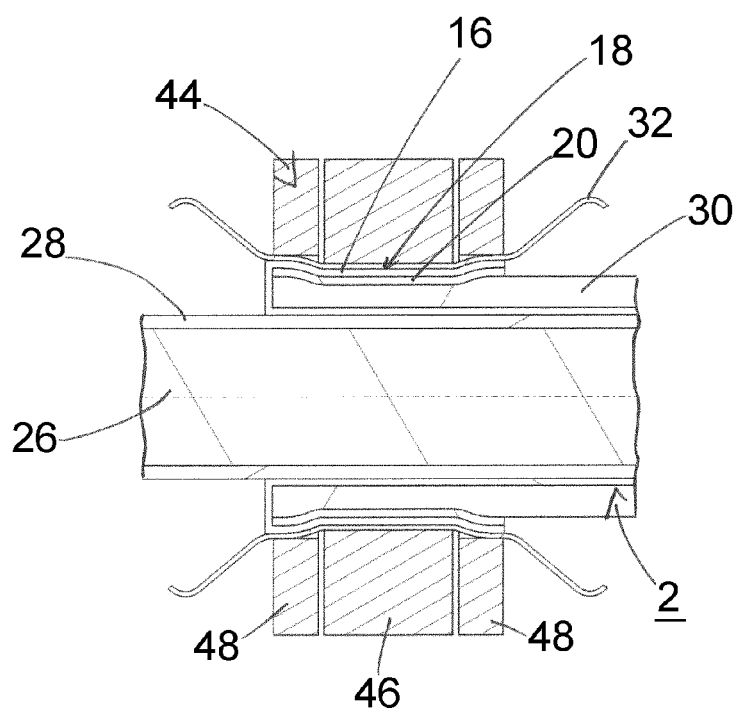
FIG. 4 is a sectional illustration for explaining a pressing procedure for configuring a double crimp between a contact sleeve and an under-sleeve, on the one hand, and between the under-sleeve and a cable sheathing, on the other hand.
Figure 5:
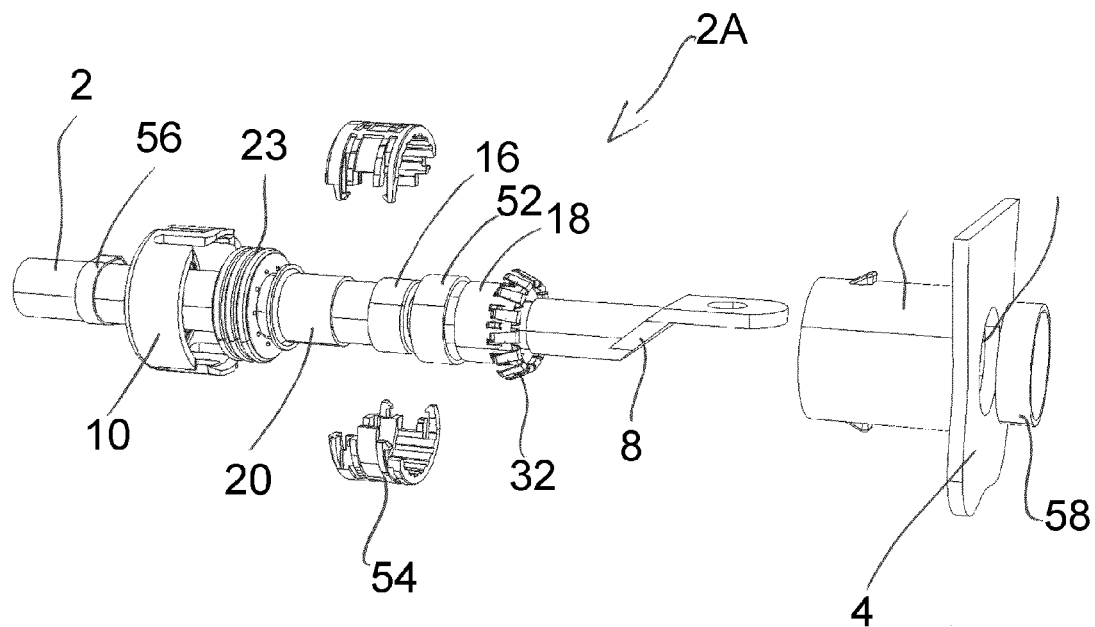
FIG. 5 is an exploded perspective illustration of a further variant of an embodiment of the high-voltage cable together with the housing having cable glands.

Fitting of the individual components of the device of the pre-assembled cable 2A will be explained in more detail hereunder by FIGS. 3A, 3B and 4. In a first step, the cable 2 at a frontal end side is stripped, that is to say that the cable sheathing 30 is removed along a defined length. The shield 16 is subsequently cut to a desired length. Thereafter, first the closure cap 10, subsequently the sealing element 23, then the spacer 22, and finally the under-sleeve 20 are pushed onto the cable 2 prepared in this way. The under-sleeve here at the end side terminates so as to be flush with the remaining cable sheathing 30. This intermediate fitting position of the pre-assembled cable 2A is illustrated in FIG. 3A.

In the next step the shield 16 is folded back by 180° and placed over the under-sleeve 20. Thereafter, sliding the contact sleeve 8 over the shield 16 is performed. This intermediate fitting position is illustrated in FIG. 3B.

Finally, simultaneous press-fitting of both the contact sleeve 18 as well as the under-sleeve 20 is performed with the aid of a press-fitting or crimping procedure. The latter is schematically illustrated in FIG. 4. A respective press-fitting tool 44 exerts a radial compression force in a central region, so that both the contact sleeve 18 as well as the under-sleeve 20 are deformed and the under-sleeve 20 is press-fitted into the cable sheathing 30. On account thereof, a high resistance to extraction is achieved between the under-sleeve 20 and the cable sheathing 30, on the one hand. At the same time a connection which is resistant to traction is also configured by the press-fit connection and by the force-fit and form-fit between the contact sleeve 18 and the under-sleeve 20. In the case of tensile stress, the traction force is therefore transmitted from the cable sheathing 30 to the under-sleeve 20, from the latter by way of the spacer 22 and the sealing element 23 finally to the closure cap 10 which then induces the tensile force by way of the mechanical snap-fit connection 12 into the housing 4. Therefore, an overall reliable mechanical stress relief is formed.

In order for the press-fit to be configured, the press-fitting tool 44 has a central press-fitting die 46 which is enclosed by a downholder 48. Defined deformation is guaranteed by way of the downholder 48.

After the press-fitting procedure, the spacer 22 is again moved forward toward the contact sleeve 18 up to the stop, and the sealing element 23 and the closure cap 10 are subsequently in each case pushed along so as to approximately abut on one another. The fixing element 24 for fixing the closure cap 10 to the cable sheathing 30 is then fastened in this position. Subsequently, the contact element 8 is fastened to the exposed conductor 26 by way of crimping, for example.

The cable 2 which has been pre-assembled in this manner for final fitting needs only to be routed through the cable gland 14 until the closure cap 10 latches to the housing 4. This here is therefore a simple plug connection.

A second variant of embodiment of the device and of the pre-assembled cable 2A will be explained hereunder by FIGS. 5 to 9. Like the first variant of embodiment, this second variant of embodiment has an under-sleeve 20 and a contact sleeve 18 which is configured as a crimp sleeve. The shield 16 is jammed between these two sleeves 18, 20. Here too, double crimping is performed, so that press-fitting to the outer cable sheathing 30 is also performed.

Like in the case of the first variant of embodiment, the sealing element 23 is embedded between the cable sheathing 30 and the cable gland 14. Moreover, fastening of the cable 2 to the housing 4 is likewise performed with the aid of the closure cap 10 by way of a snap-fit connection.

As a point of differentiation in relation to the first variant of embodiment, the contact sleeve 18 however has a crown of springs tongue 32 only on the front side. A cylindrical portion of the contact sleeve 18 adjoins this outwardly bent crown.

The under-sleeve 20, which in the first exemplary embodiment is configured as a true cylindrical sleeve, in this variant of embodiment at the rear end thereof that faces away from the springs tongue 32 has a collar 50 which is configured by bending back. The collar 50 here in particular is configured so as to be annular.

Furthermore, the contact sleeve 18 in the rearward and cylindrical region thereof is surrounded by an auxiliary sleeve 52 which in particular serves as a crimping aid. The auxiliary sleeve 52 therefore bears directly on the contact sleeve 18 and keeps the latter in the desired shape. The contact sleeve 18 is in particular again a bent punched sheet-metal part which in relation to the sleeve is bent in an annular manner. The point of abutment between the two ends of the sheet-metal plate in this variant are not interconnected in a materially integral manner. The auxiliary sleeve 52 keeps the contact sleeve 18 in shape. The auxiliary sleeve 52 is pushed over the contact sleeve 18 already prior to the crimping procedure.

Furthermore, the cable 2 in an expedient design embodiment has an intermediate sleeve 54 which is formed in particular from two half-shells and which radially surrounds the crimping elements, that is to say the contact sleeve 18 and the under-sleeve 20 and, if and when present, also the auxiliary sleeve 52. The intermediate sleeve 54 here in the axial direction has a front portion, which surrounds the contact sleeve 18 and the auxiliary sleeve 52, and a rear portion, which directly adjoins the under-sleeve 20 in the radial direction. In particular, the two portions adjoin one another while configuring a step. The intermediate sleeve 54 in both axial portions has the same external circumference. On account of the ledge which is formed in relation to the rear portion, the intermediate sleeve 54 is embedded between the collar 50 and the contact sleeve 18 and/or the auxiliary sleeve 52 in a form-fitting manner, in particular. Axial fixing is achieved on account thereof. At the same time, the intermediate sleeve 54 by way of a frontal end side bears on the stop 42 of the cable gland 14. On account thereof, overall protection against axial extraction is achieved. The latter is also supported by way of the connection of the cable gland 14 to the closure cap 10. A snap-fit connection 12 is also preferably configured to this end in the case of the second variant of embodiment. The closure cap 10 is again fixed to the cable 2 by a cable tie 56 or of another fixing element, for example.

As a point of differentiation in relation to the first variant of embodiment, the intermediate sleeve 54 and not the springs tongue 32 bears in a form-fitting manner on the stop 42. The springs tongue 32 project beyond the stop 42 in the longitudinal direction and are pressed against the latter in the radial direction. As opposed to how this is illustrated in the sectional illustrations of FIGS. 6 and 7, the springs tongue here are inwardly deformed in an elastic manner, so that they bear on the internal surface of the cable gland 14.

Figure 6:
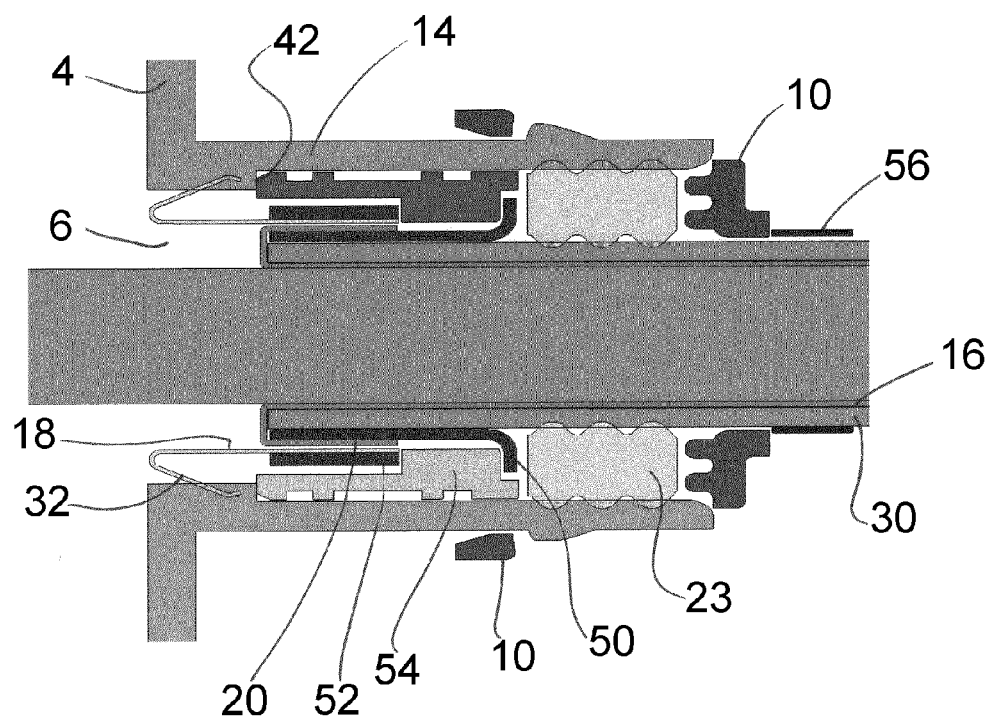
FIG. 6 is a cross-sectional illustration of a detail of the cable according to FIG. 5 in a fitted state in a cable gland.

In the case of the variant of embodiment according to FIG. 6, the stop 52 is an integral component part of the cable gland 14, the former thus configuring a step on the internal wall of the latter.

Figure 7:
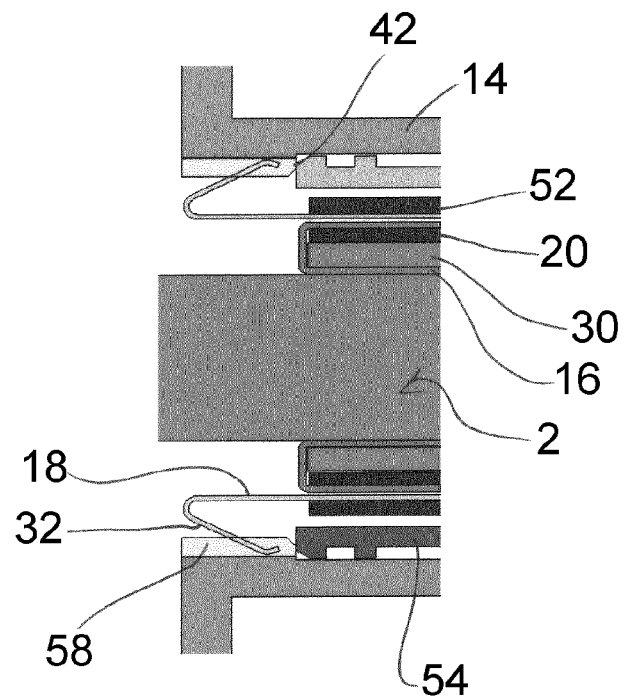
FIG. 7 is a cross-sectional illustration of the cable according to FIG. 5 which in detail is enlarged, in the case of an alternative design embodiment of the cable gland, having an insert part for improved contact.

In an alternative design embodiment thereto, the stop is expediently formed by an insert 58, as is illustrated in FIG. 7. This insert is in particular a ring, for example a press-fitted ring. Alternatively, the ring is connected to the internal wall of the cable gland 14 by welding or soldering/brazing, for example. This insert 58 is composed of a material which is dissimilar to that of the cable gland 14, having good electrical conductivity and being in particular from a copper alloy, for example a copper-tin alloy, or else from zinc or a zinc alloy.

Figure 8:
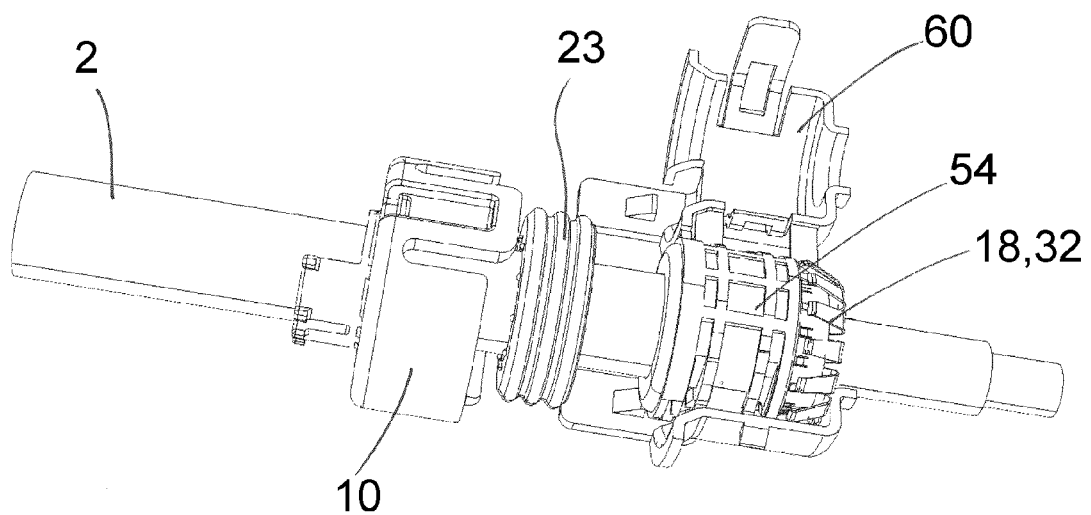
FIG. 8 is a perspective illustration of the cable in an intermediate state of fitting, having a bipartite cap assembly as a transportation protection device of the cable.
Figure 9:
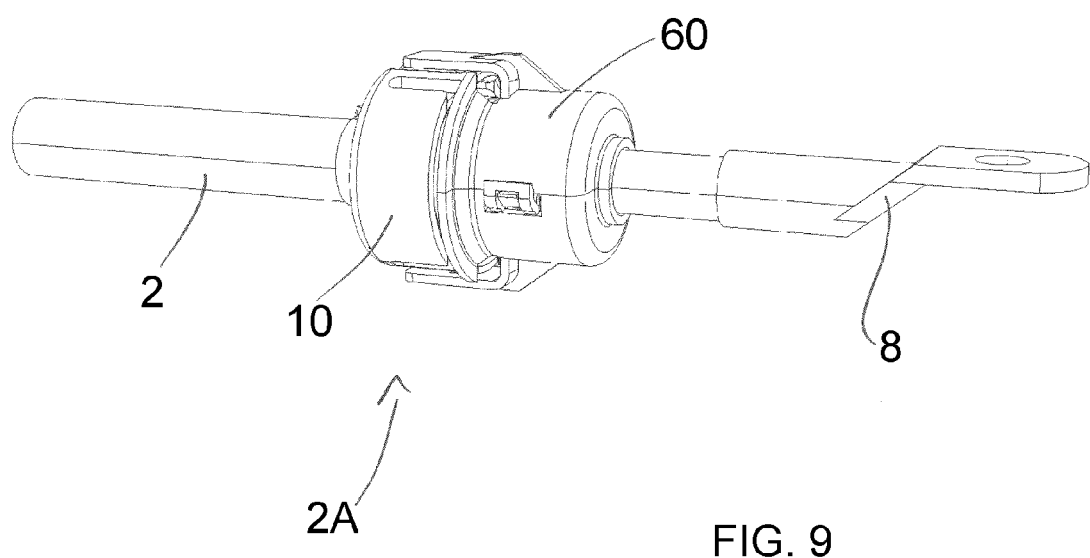
FIG. 9 is a perspective illustration of a detail of a cable end of the cable according to FIG. 5, as has been prepared for transportation.

As can be derived in particular from FIGS. 8 and 9, a protective cap 60 which at least partially and preferably in the longitudinal direction completely houses the individual crimp elements is additionally provided to the closure cap 10 for transportation purposes. The protective cap 60 here is preferably formed from two half-shells which are interconnected by integral hinges or similar, for example. On account thereof, the protective cap 60 may be attached around the crimp parts and removed therefrom again in a simple manner. As can be derived from FIG. 8, the protective cap 60 in particular completely surrounds the crimp elements, that is to say the contact sleeve 18 and the under-sleeve 20, in the longitudinal direction. On account thereof, the protective cap 60 also encloses the intermediate sleeve 54.

The protective cap 60 is connected to the closure cap 10 during fitting, so that the two caps 10, 60 are fixed to one another. A latching connection is provided to this end, in particular. The protective cap 60 here by way of a latching element expediently engages in the same latching element of the protective cap 10 which is also used at a later time for latching the closure cap 10 to the contact connector 14.

During fitting and pre-assembly of the pre-assembled cable 2A, the cable 2 is first cut to the desired length and at the frontal end the central conductor and/or the shield 16 is/are exposed in a manner known per se. Subsequently, the closure cap 10 is first pushed onto the cable sheathing 30, and thereafter the sealing element 23. Then the under-sleeve 20 is pushed thereonto, and the shield is bent back by 180°, so that the latter comes to lie on the outer sheathing of the under-sleeve 20. Thereafter, the prepared functional group, composed of the contact sleeve 18 and the auxiliary sleeve 52, is pushed over the shield 16. Subsequently, the crimping process which has already been described in the context of the first variant of embodiment is performed. After the crimping process the intermediate sleeve 52 is disposed, prior to the protective cap 60 being attached and connected to the closure cap 10. The closure cap 10 is then fixed to the cable 2 by means of the cable tie 56. Finally, the contact element 8 is crimp-fitted to the conductor 26.

The following is a summary list of reference numerals and the corresponding structure used in the above description of the invention:

2 Cable
2A Pre-assembled cable
4 Housing
6 Cable entry
8 Contact element
10 Closure cap
12 Snap-fit connection
14 Cable gland
16 Shield
18 Contact sleeve
20 Under-sleeve
22 Spacer
23 Sealing element
24 Fixing element
26 Conductor
28 Conductor insulation
30 Cable sheathing
32 Spring tongue
34 Sleeve shaft
36 Annular web
38 Base
40 Retaining web
42 Stop
44 Press-fitting tool
46 Press-fitting die
48 Downholder
50 Collar
52 Auxiliary sleeve
54 Intermediate sleeve
56 Cable tie
58 Insert
60 Protective cap

The invention claimed is:

1. A pre-assembled electrical cable for routing through a cable gland of a housing, the pre-assembled electrical cable comprising:
    a cable sheathing;
    a shield surrounded by said cable sheathing;
    an under-sleeve;
    a contact sleeve being press-fitted to said under-sleeve while said shield is interlayered, said contact sleeve having an end side with a plurality of contact springs configured as spring tongues and which are configured for establishing electrical contact on an internal wall of the cable gland; and
    a bipartite cap assembly having a closure cap surrounding said contact sleeve and said closure cap configured for being pulled over the cable gland and for connection thereto said closure cap is pulled over said cable sheathing and is fixed in a defined position to said cable sheathing, wherein an annular space is configured between said contact sleeve and said closure cap, said bipartite cap assembly further having a protective cap which serves as a temporary transportation protection device and adjoins said closure cap and surrounds said end side of said contact sleeve with said contact springs so that said contact springs are protected by said protective cap.

2. The pre-assembled electrical cable according to claim 1, wherein said closure cap forms part of a snap-fit connection, said closure cap in a fitted state is connected to the cable gland by way of said snap-fit connection.

3. The pre-assembled electrical cable according to claim 1, wherein said contact sleeve has at both end sides said spring tongues.

4. The pre-assembled electrical cable according to claim 1, wherein said spring tongues are configured so as to be dissimilar to one another, so as to have dissimilar natural frequencies.

5. The pre-assembled electrical cable according to claim 1, wherein said contact sleeve is formed from a bent punched sheet-metal part.

6. The pre-assembled electrical cable according to claim 1, wherein said spring tongues have a punching degree which in a radial direction is outwardly oriented.

7. The pre-assembled electrical cable according to claim 1, further comprising:
a sleeve-shaped holder being a separate part; and
a sealing element embedded between said sleeve-shaped holder and a base of said closure cap, the pre-assembled electrical cable being routed through said sealing element.

8. The pre-assembled electrical cable according to claim 7, wherein said sleeve-shaped holder has a sleeve shaft by way of which said sleeve-shaped holder bears on said cable sheathing, wherein said contact springs of said contact sleeve are pulled over said sleeve shaft.

9. The pre-assembled electrical cable according to claim 7, wherein said sleeve-shaped holder functions as a spacer, said spacer having an annular web holding the pre-assembled electrical cable in a centric manner in a cable entry of the housing.

10. The pre-assembled electrical cable according to claim 1, further comprising an intermediate sleeve being a separate part, wherein said contact sleeve is surrounded by said intermediate sleeve which in a fitted state is positioned between said contact sleeve and the cable gland.

11. The pre-assembled electrical cable according to claim 10, wherein said intermediate sleeve for axially fixing said contact sleeve in a form-fitting manner is configured within the cable gland and to this end is embedded between a stop of the cable gland and a collar of said under-sleeve or said contact sleeve.

12. The pre-assembled electrical cable according to claim 10, further comprising an auxiliary sleeve disposed around said contact sleeve.

13. The pre-assembled electrical cable according to claim 1, further comprising an insert formed from a material being dissimilar to that of the cable gland and inserted in the cable gland, said spring tongues in a fitted state bearing on said insert.

14. The pre-assembled electrical cable according to claim 1, wherein said closure cap serves as a transportation protection and extends over a whole of said contact sleeve in a longitudinal direction so that said contact sleeve is housed within said closure cap completely.

15. The pre-assembled electrical cable according to claim 1, wherein said protective cap is releasable fixed to said closure cap.

16. The pre-assembled electrical cable according to claim 15, wherein said protective cap has two half shells.

* * * * *